United States Patent
Okahiro et al.

(10) Patent No.: US 8,391,085 B2
(45) Date of Patent: Mar. 5, 2013

(54) SEMICONDUCTOR MEMORY DEVICE CAPABLE OF MATCHING THE TIMING BETWEEN SUB-AMPLIFIER CONTROL SIGNAL AND COLUMN SELECTION SIGNAL

(75) Inventors: Tetsuaki Okahiro, Tokyo (JP); Hiromasa Noda, Tokyo (JP); Jun Suzuki, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 433 days.

(21) Appl. No.: 12/605,755

(22) Filed: Oct. 26, 2009

(65) Prior Publication Data
US 2010/0142246 A1 Jun. 10, 2010

(30) Foreign Application Priority Data

Oct. 30, 2008 (JP) ................................ P2008-279745

(51) Int. Cl.
*G11C 7/22* (2006.01)
(52) U.S. Cl. .. 365/189.14; 365/51; 365/63; 365/230.03; 365/208; 365/207; 365/205; 365/190
(58) Field of Classification Search .................. 365/190, 365/205, 208, 207, 189.14, 189.15, 189.16, 365/51, 63, 230.03
See application file for complete search history.

(56) References Cited

U.S. PATENT DOCUMENTS 5,422,853 A * 6/1995 Miyamoto .................... 365/205
6,894,940 B2 * 5/2005 Kono et al. .................... 365/205

FOREIGN PATENT DOCUMENTS
JP 11-214652 8/1999

* cited by examiner

*Primary Examiner* — Andrew Q Tran
(74) *Attorney, Agent, or Firm* — McDermott Will & Emery LLP

(57) ABSTRACT

A semiconductor memory device comprises a plurality of memory cell mats, a plurality of sub-word driver regions and a plurality of sense amplifier regions, a plurality of intersection regions, a sub-amplifier, and a start signal (a control signal) supply circuit (a sub-amplifier control circuit). A plurality of sub-word driver regions and a plurality of sense amplifier regions are disposed adjacent to the plurality of memory cell mats. A plurality of intersection regions are intersection regions between the plurality of sub-word driver regions and the plurality of sense amplifier regions. The sub-amplifier is disposed in a first intersection region among the plurality of intersection regions. The start signal supply circuit is disposed in a second intersection region among the plurality of intersection regions, and supplies a start signal (a control signal) of the sub-amplifier to the sub-amplifier based on a sub-amplifier timing signal supplied from the extending direction of the sub-word driver region.

10 Claims, 6 Drawing Sheets

SEMICONDUCTOR MEMORY DEVICE CAPABLE OF MATCHING THE TIMING BETWEEN SUB-AMPLIFIER CONTROL SIGNAL AND COLUMN SELECTION SIGNAL

BACKGROUND OF THE INVENTION

1. Field of the Invention

The present invention relates to a semiconductor memory device.

Priority is claimed on Japanese Patent Application No. 2008-279745, filed Oct. 30, 2008, the content of which is incorporated herein by reference.

2. Description of Related Art

A semiconductor memory device comprising a sub-amplifier which amplifies a signal of a sense amplifier is well known. In such a semiconductor memory device comprising a sub-amplifier, a control signal of a sub-amplifier circuit is input from the direction of column decoder in order to easily match the timing of the control signal to that of a column selection signal (refer to Japanese Unexamined Patent Application, First Publication, No. H11-214652). Patent Document 1 discloses that matching the timing between a control signal DREADT of the sub-amplifier circuit and a column selection signal YS is easier when the control signal DREADT of the sub-amplifier circuit is input from the side of a column decoder region 3.

SUMMARY

In one embodiment, there is provided a semiconductor memory device that includes at least: a plurality of memory cell mats; a plurality of sub-word driver regions and a plurality of sense amplifier regions that are disposed adjacent to the plurality of memory cell mats; a plurality of intersection regions that are intersection regions between the plurality of sub-word driver regions and the plurality of sense amplifier regions; a sub-amplifier disposed in a first intersection region among the plurality of intersection regions; and a start signal (a control signal) supply circuit (a sub-amplifier control circuit) that is disposed in a second intersection region, which is different from the first intersection region, among the plurality of intersection regions, and that supplies a start signal (a control signal) of the sub-amplifier to the sub-amplifier based on a sub-amplifier timing signal supplied from the extending direction of the sub-word driver region.

Moreover, in another embodiment, there is provided a semiconductor memory device that includes at least: a plurality of memory cell mats; a plurality of sub-word driver regions which are disposed adjacent to the plurality of memory cell mats and each of which has a sub-word driver circuit; a plurality of sense amplifier regions which are disposed adjacent to the plurality of memory cell mats and each of which has a sense amplifier circuit; a plurality of sub-amplifiers that are disposed in a sense amplifier column comprising the sense amplifier region where the plurality of sense amplifier circuits simultaneously activated according to a selection operation of a memory cell mat column by a memory cell mat address, which selects one of memory cell mat columns comprising the plurality of memory cell mats among sense amplifier columns comprising the plurality of sense amplifier regions, are disposed; and a plurality of start signal supply circuits that supplies start signals of the sub-amplifiers commonly to at least some of the plurality of sub-amplifiers.

In addition, in still another embodiment, there is provided a semiconductor memory device that includes at least: a plurality of memory cell mats; a plurality of sub-amplifiers provided so as to correspond to the plurality of memory cell mats; and a start signal (a control signal) supply circuit (a sub-amplifier control circuit) which supplies a start signal (a control signal) of the sub-amplifier to the plurality of sub-amplifiers, wherein the start signal supply circuit supplies the start signal of the sub-amplifier to the plurality of sub-amplifiers such that only the sub-amplifier, which is provided so as to correspond to the activated memory cell mat among the plurality of memory cell mats, is activated.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
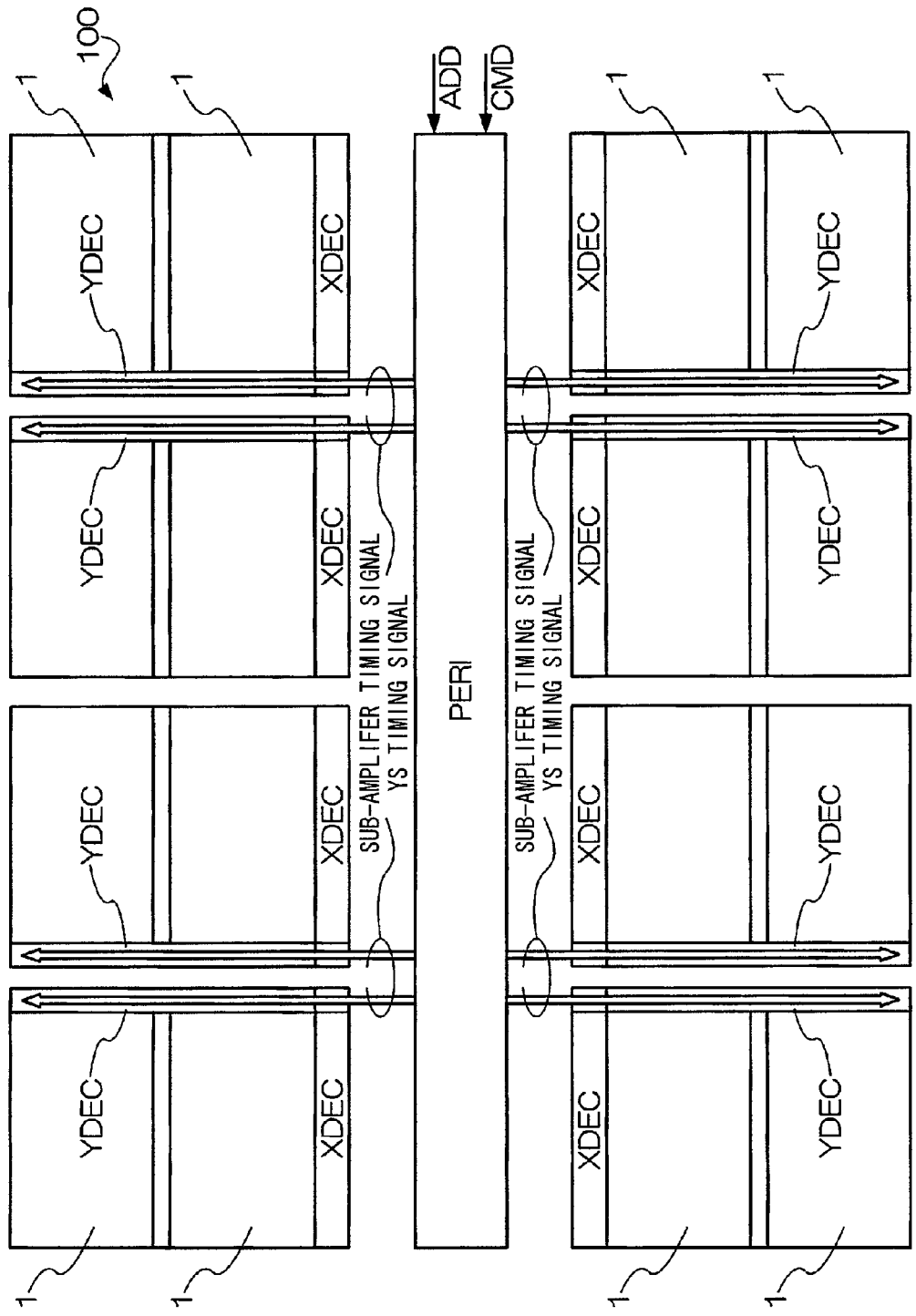
FIG. 1 is a plan view schematically illustrating a column-based signal path in a semiconductor memory device according to an embodiment of the invention.

Hereinafter, embodiments of the invention will be described with reference to the accompanying drawings. FIG. 1 is a schematic view illustrating a column-based signal path in a semiconductor memory device 100 according to an embodiment of the invention. In this example, the semiconductor memory device 100 comprises a peripheral circuit region PERI, a row decoder region XDEC, a column decoder region YDEC extending in a direction perpendicular to the extending direction of the row decoder region XDEC, a memory array region 1 with a plurality of memory cell mats, and the like. Moreover, in the semiconductor memory device 100, an address ADD input from the outside and a YS timing signal (column selection circuit start timing signal), which is generated based on a command CMD in the peripheral circuit region PERI, are supplied to the column decoder region YDEC. The YS timing signal is a signal for ON/OFF control of a YSW (column selection circuit) provided between a common IO line (common input/output line), such as a local IO line (local input/output line), and a bit line (or data line). In addition, the address ADD input from the outside and a sub-amplifier timing signal, which is generated based on the command CMD in the peripheral circuit region PERI, are supplied to the column decoder region YDEC together with the YS timing signal.

Next, the configuration of the memory array region 1 shown in FIG. 1 will be described in more detail with reference to FIG. 2. Moreover, in the drawings, the same components are denoted by the same reference numerals. A plurality of sub-amplifiers 2 is provided in the memory array region 1 shown in FIG. 2. A pair of local IO lines LIO and a main IO line (main input/output line) MIO are provided so as to correspond to one sub-amplifier. A sub-amplifier start timing signal which is generated by a gate circuit (AND gate in FIG. 2) 3 serving as a start signal (a control signal) supply circuit (a sub-amplifier control circuit) is supplied to the sub-amplifier 2 through a sub-amplifier start timing signal line 4. The sub-amplifier start timing signal is a signal for controlling whether to start the sub-amplifier 2. The sub-amplifier 2 and the gate circuit 3 are provided in plural numbers in the memory array region 1. In the example shown in FIG. 2, the sub-amplifier start timing signals supplied to the eight sub-amplifiers 2 are generated by the two gate circuits 3. In addition, the gate circuit 3 generates a sub-amplifier timing signal by performing an AND operation between a MAT address (memory cell MAT address) and the sub-amplifier start timing signal. The sub-amplifier start timing signal line 4 used herein is laid in a direction (vertical direction in the drawing) perpendicular to the extending direction (horizontal direction in the drawing) of the row decoder region XDEC.

Figure 2:
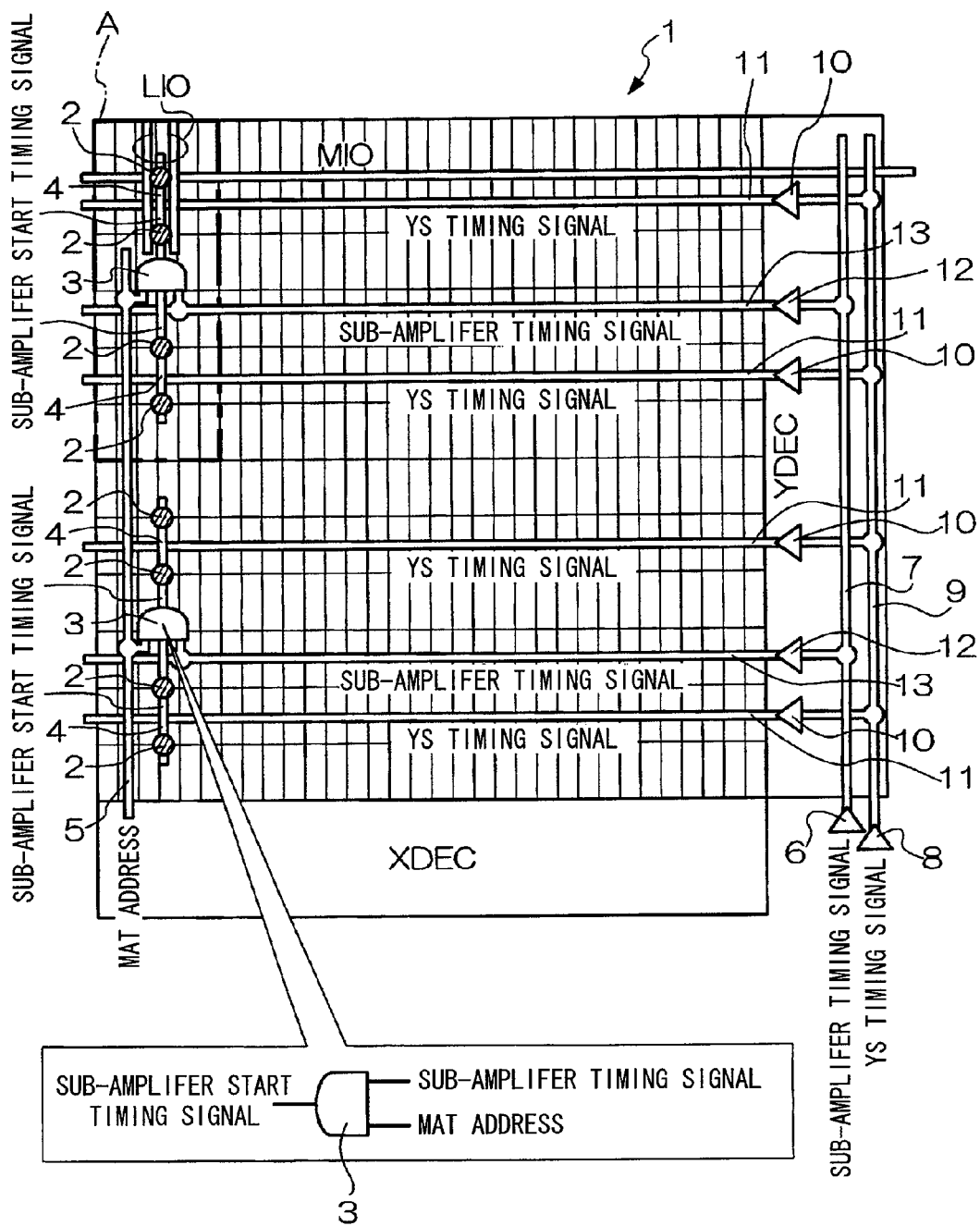
FIG. 2 is a plan view schematically illustrating a column-based signal path in a memory array region 1 in the semiconductor memory device shown in FIG. 1 in more detail.
Figure 3:
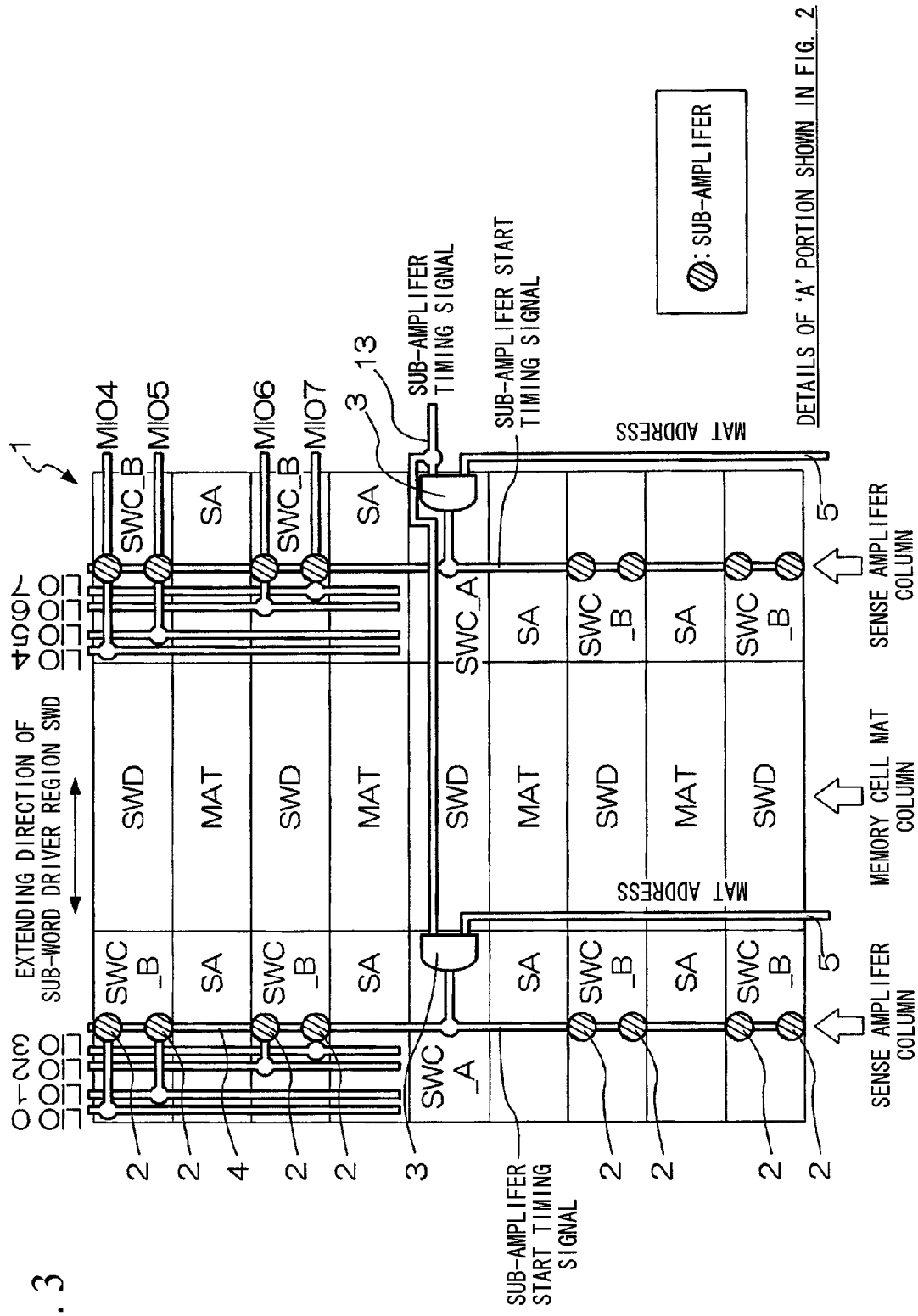
FIG. 3 is a plan view schematically illustrating a column-based signal path within the memory array region 1 corresponding to the 'A' portion surrounded by the chain line in FIG. 2.

The MAT address in FIG. 2 is generated by decoding a row address, which is input from the outside, through a row decoder in the row decoder region XDEC. The MAT address is a signal for selecting a predetermined memory cell mat column. That is, the MAT address is a signal supplied from a direction perpendicular to the extending direction of a sub-word driver region SWD shown in FIG. 3 and is a signal for selecting one memory cell mat column comprising a plurality of memory cell mats MAT arrayed in the direction perpendicular to the extending direction of the sub-word driver region SWD. The MAT address is supplied from the side of the row decoder region XDEC to the memory array region 1 through the MAT address line 5. In addition, a plurality of sense amplifier circuits disposed in a predetermined sense amplifier region corresponding to the selected memory cell mat column is activated according to the selection operation of a predetermined memory cell mat column based on the MAT address. Here, the memory cell mat column means that the plurality of memory cell mats MAT are vertically arrayed as shown in FIG. 3 (specifically, the plurality of memory cell mats MAT and the plurality of sub-word driver regions SWD, which are disposed adjacent to each of the plurality of memory cell mats MAT, are arrayed alternately in one column and in a direction perpendicular to the extending direction of the sub-word driver region SWD). The MAT address line 5 is laid in a direction (vertical direction in the drawing) perpendicular to the extending direction (horizontal direction in the drawing) of the row decoder region XDEC.

In addition, the sub-amplifier timing signal in FIG. 2 is a signal which is activated when starting the sub-amplifier 2, and is supplied from the side of the column decoder region YDEC to the memory array region 1 together with the YS timing signal (column selection circuit start timing signal). The reason why the sub-amplifier timing signal is supplied from the side of the column decoder region YDEC is to reduce the skew between a YSW (column selection circuit; not shown) and the sub-amplifier 2. In this example, the sub-amplifier timing signal generated in the peripheral circuit region PERI shown in FIG. 1 is input to the sub-amplifier timing signal line 7 through a driver circuit 6. The sub-amplifier timing signal line 7 is laid in the extending direction (vertical direction in the drawing) of the column decoder region YDEC. In addition, the YS timing signal generated in the peripheral circuit region PERI shown in FIG. 1 is input to the YS timing signal line 9 through a driver circuit 8. The YS timing signal line 9 is also laid in the extending direction (vertical direction in the drawing) of the column decoder region YDEC. In addition, the YS timing signal on the YS timing signal line 9 is transmitted on a YS timing signal line 11 through a driver circuit 10. In addition, the sub-amplifier timing signal on the sub-amplifier timing signal line 7 is transmitted on a sub-amplifier timing signal line 13 through a driver circuit 12. The YS timing signal line 11 and the sub-amplifier timing signal line 13 are laid in the extending direction (horizontal direction in the drawing) of the row decoder region XDEC.

Moreover, in the example shown in FIG. 2, the two gate circuits 3 are provided and each of the gate circuits 3 controls the start of the four sub-amplifiers 2. However, there is no limitation in the number of gate circuits 3. The greater the number of gate circuits 3, the more effective the reduction of the skew.

Next, details of the 'A' portion surrounded by the chain line in FIG. 2 will be described with reference to FIG. 3. In the example shown in FIG. 3, it is assumed that a sub-amplifier start timing signal is supplied from each gate circuit 3 to at least eight sub-amplifiers 2. In addition, in FIG. 3, some local IO lines LIO and main IO lines MIO connected to the plurality of sub-amplifiers 2 are expressed as local IO lines LIO0 to LIO7 and main IO lines MIO4 to MIO7.

In the memory array region 1 shown in FIG. 3, the sub-word driver region SWD and the sense amplifier region SA are disposed adjacent to each of the plurality of memory cell mats MAT. The sub-word driver region SWD is disposed such that the extending direction matches the extending direction of the row decoder region XDEC shown in FIG. 2. Accordingly, the sub-amplifier timing signal line 13 disposed in the extending direction of the row decoder region XDEC is laid in the extending direction (horizontal direction in the drawing) of the sub-word driver region SWD. A sub-word driver circuit (not shown) is provided in the sub-word driver region SWD. In addition, a sense amplifier circuit (not shown) is disposed in the sense amplifier region SA. As to the intersection regions between the sub-word driver regions SWD and the sense amplifier regions SA, there are two kinds of intersection regions, that is, an intersection region SWC_A in which the gate circuit 3 that is a start signal (a control signal) supply circuit (a sub-amplifier control circuit) is disposed and an intersection region SWC_B in which one or the plurality of sub-amplifiers 2 is disposed. The gate circuit 3 activates the sub-amplifier start timing signal corresponding to the predetermined memory cell mat MAT by performing a logic operation between the MAT address and the sub-amplifier timing signal.

Moreover, although an example in which the two sub-amplifiers 2 (shaded by oblique lines in the drawing) are disposed in one intersection region SWC_B is shown in FIG. 3, the invention is not limited thereto. The number of sub-amplifiers 2 disposed in the intersection region SWC_B may be changed according to the area of the intersection region, arrangement of the main IO lines MIO, and the like. In addition, a column in which the plurality of sense amplifier regions SA are arrayed in a direction perpendicular to the extending direction of the sub-word driver region SWD so as to be adjacent to the memory cell mat column is assumed to be a sense amplifier column. The sense amplifier region SA and the intersection region SWC_A or SWC_B are alternately included in the sense amplifier column.

Next, a specific example of the configuration of each of the intersection regions SWC_A and SWC_B shown in FIG. 3 will be described with reference to a circuit diagram shown in FIG. 4. Moreover, in the example shown in FIG. 4, the sub-amplifier timing signals on the sub-amplifier timing signal line 13 shown in FIG. 3 comprise three signals including a sub-amplifier WRITE timing signal DLIOWR and a sub-amplifier READ timing signal DLIORD which respectively change to the high level ('H' level) indicating the activation potential when writing and reading data, and an LIO precharge signal DLIOPRE which changes to the low level ('L' level) indicating the activation potential at the time of precharge. Moreover, the sub-amplifier start timing signals on the sub-amplifier start timing signal line 4 shown in FIG. 3 comprise three signals including an in-array sub-amplifier WRITE start timing signal ALIOWR and an in-array sub-amplifier READ start timing signal ALIORD which respectively change to the high level ('H' level) indicating the activation potential when writing and reading data, and an in-array LIO precharge signal ALIOPRE which changes to the low level ('L' level) indicating the activation potential at the time of precharge.

Figure 4:
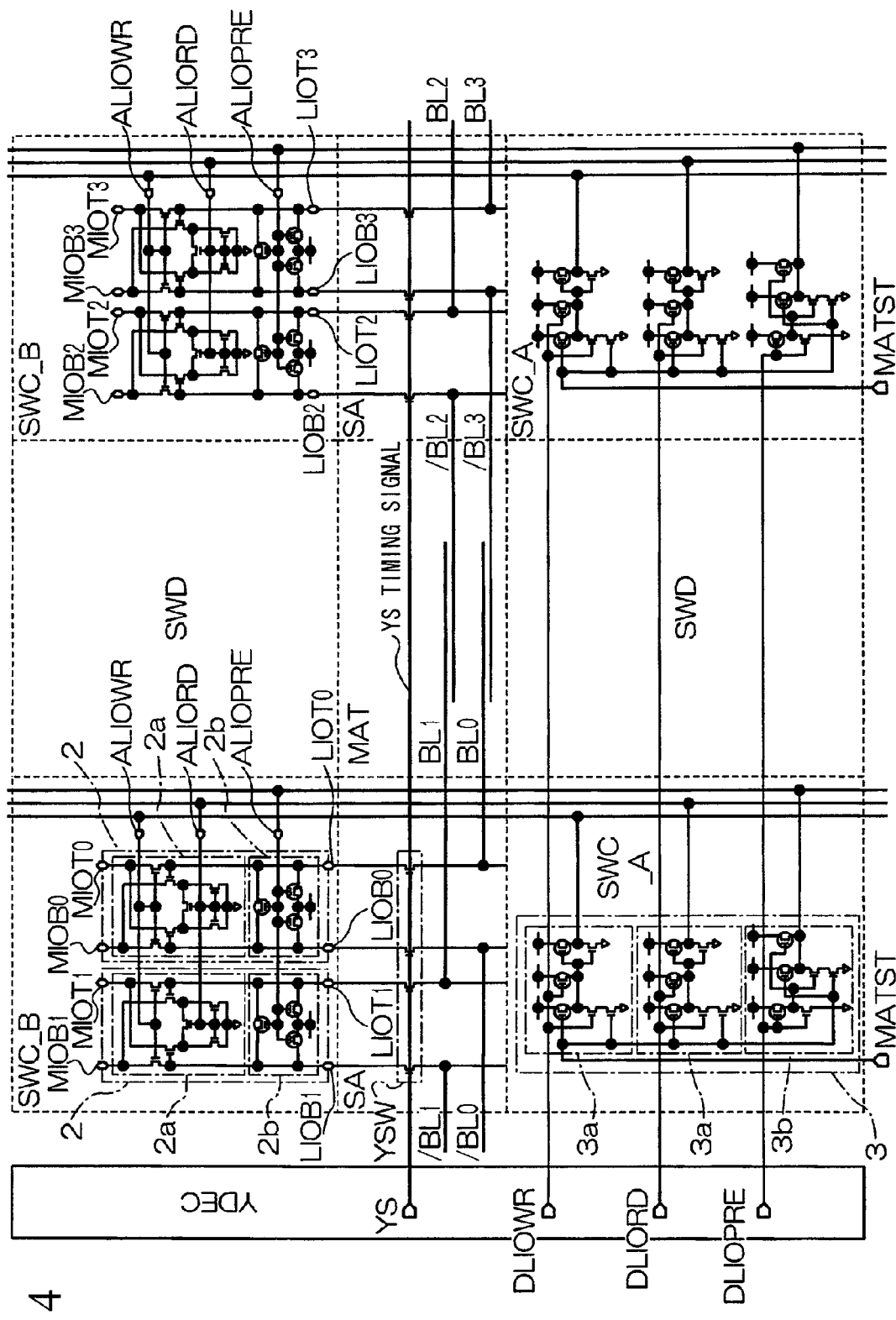
FIG. 4 is a circuit diagram illustrating a specific example of the configuration of each of the intersection regions SWC_A and SWC_B shown in FIG. 3.

The semiconductor memory device shown in FIG. 4 has a plurality of memory cells, each of which is connected to a corresponding bit line and a corresponding sub-word line, in a memory cell mat. In addition, a predetermined memory cell is selected by activating the corresponding sub-word line using a sub-word driver circuit disposed in the sub-word driver region SWD. The selected memory cell supplies the held data to the corresponding bit line. The data supplied to the corresponding bit line is amplified by a sense amplifier circuit disposed in the sense amplifier region SA and is then supplied to the corresponding local IO line LIO through the column selection circuit YSW. The data supplied to the corresponding local IO line LIO is amplified by the sub-amplifier 2 and is then supplied to the corresponding main IO line MIO.

In the example shown in FIG. 4, the two sub-amplifiers 2 are disposed side by side on the left and right sides of the intersection region SWC_B. Each sub-amplifier 2 has a current mirror type differential amplifier 2a (upper portion) and an equalizer circuit 2b (lower portion). The differential amplifier 2a is formed by using a plurality of n-channel MOS (metal oxide semiconductor) transistors. Moreover, the differential amplifier 2a is controlled by the ALIOWR signal, which changes to a high ('H') level indicating the activation potential when writing data, and the ALIORD signal, which changes to the high ('H') level indicating the activation potential when reading data, the ALIOWR signal and the ALIORD signal being signals supplied from the start signal supply circuit (gate circuit 3) within the intersection region SWC_A. In addition, the equalizer circuit 2b is formed by using a plurality of p-channel MOS transistors and is controlled by the ALIOPRE signal, which is a signal supplied from the start signal supply circuit (gate circuit 3) within the intersection region SWC_A and which changes to the low ('L') level indicating the activation potential at the time of precharge.

In addition, a differential amplifier 2a side (upper side) in each sub-amplifier 2 is connected to the main IO line MIO (MIOB1, MIOT1, and the like), and the equalizer circuit 2b side (lower side) is connected to the local IO line LIO (LIOB1, LIOT1, and the like). In addition, the main IO lines MIOB0 to MIOB3 are signal lines having complementary relationships with the main IO lines MIOT0 to MIOT3, and the local IO lines LIOB0 to LIOB3 are signal lines having complementary relationships with the local IO lines LIOT0 to LIOT3. In addition, the local IO lines LIOB0 to LIOB3 and LIOT0 to LIOT3 are connected to complementary bit lines /BL0 to /BL3 and BL0 to BL3 through a n-channel MOS transistor with a gate terminal to which the YS timing signal (column selection circuit start timing signal YS) is input. The YSW (column selection a plurality of n-channel MOS transistors with gate terminals to which the YS timing signal is input. Here, the bit lines BL and /BL are signal lines connected to memory cells within the memory cell mat MAT.

On the other hand, the start signal supply circuit (gate circuit 3) is provided in the intersection region SWC_A. In this case, the gate circuit 3 having two AND circuits 3a and one NAND circuit 3b (where, a signal DLIPRE is a negative logic input) is provided in the intersection region SWC_A. In addition, a MAT address signal (low-based signal) MATST, which corresponds to the MAT address on the MAT address line 5 in FIG. 3, and the sub-amplifier WRITE timing signal DLIOWR, the sub-amplifier READ timing signal DLIORD, and the LIO precharge signal DLIOPRE, which correspond to the sub-amplifier timing signals on the sub-amplifier timing signal line 13 in FIG. 3, are input to the intersection region SWC_A. Here, the MAT address signal (low-based signal) MATST is a signal which changes to the high level ('H' level) indicating the activation potential when the MAT address is selected.

In addition, a result of AND operation between the signal MATST and the signal DLIOWR is generated as the signal ALIOWR (signal DLIOWR='H' if signal ALIOWR='H' and signal MATST='H'), and a result of AND operation between the signal MATST and the signal DLIORD is generated as the signal ALIORD (signal ALIORD='H' when signal MATST='H' and signal DLIORD='H'). Moreover, the MATST signal and the LIO precharge signal DLIOPRE are generated such that the signal ALIOPRE changes to the 'L' level when the MATST signal is at the 'H' level and the LIO precharge signal DLIOPRE is at the L level (signal ALIOPRE='L' when signal MATST='H' and signal DLIOPRE='L'; inverted signal of a result of AND operation between the MATST signal and the DLIOPRE signal is output).

Figure 5:
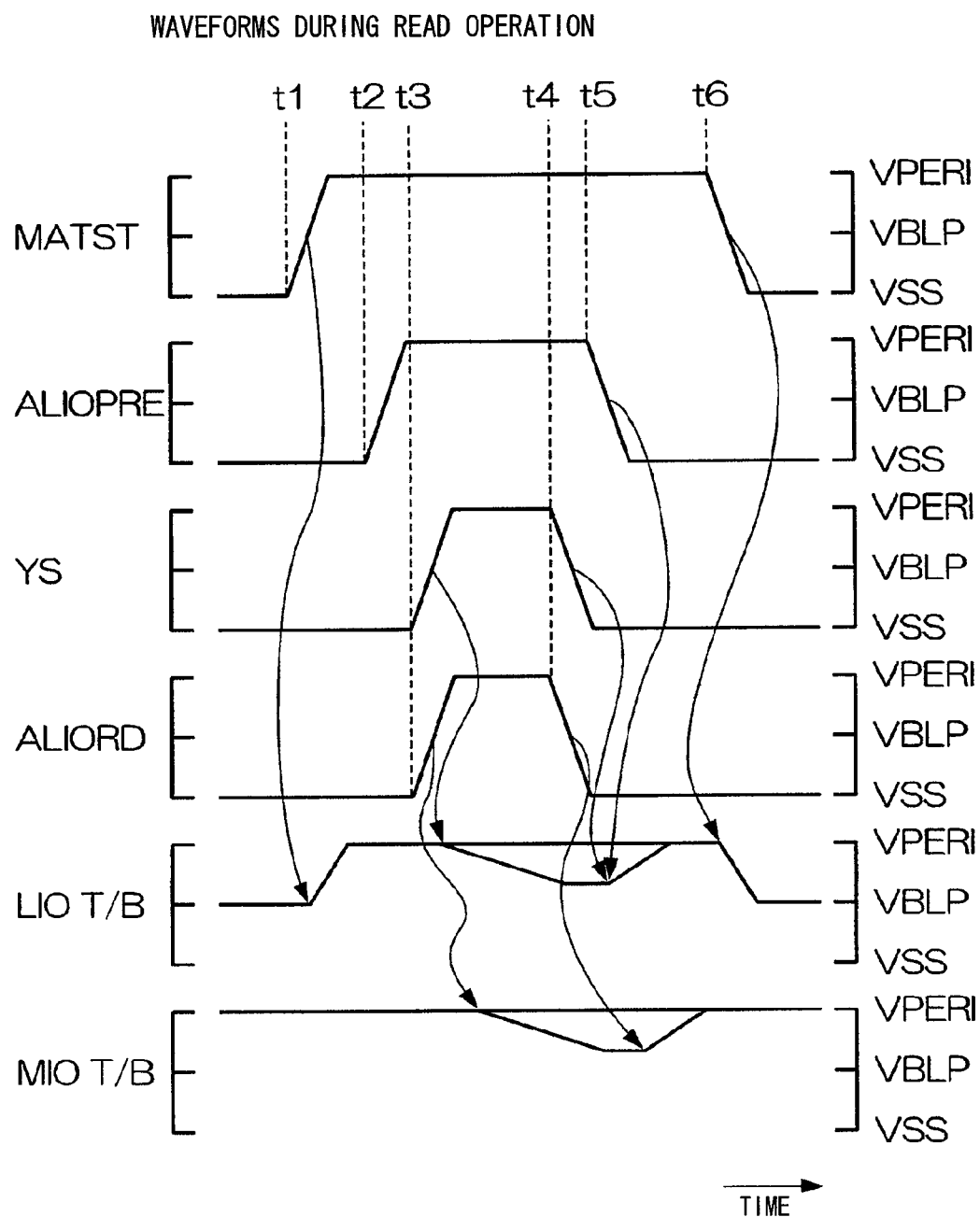
FIG. 5 is a waveform chart illustrating an operation when reading data in the configuration shown in FIG. 4.
Figure 6:
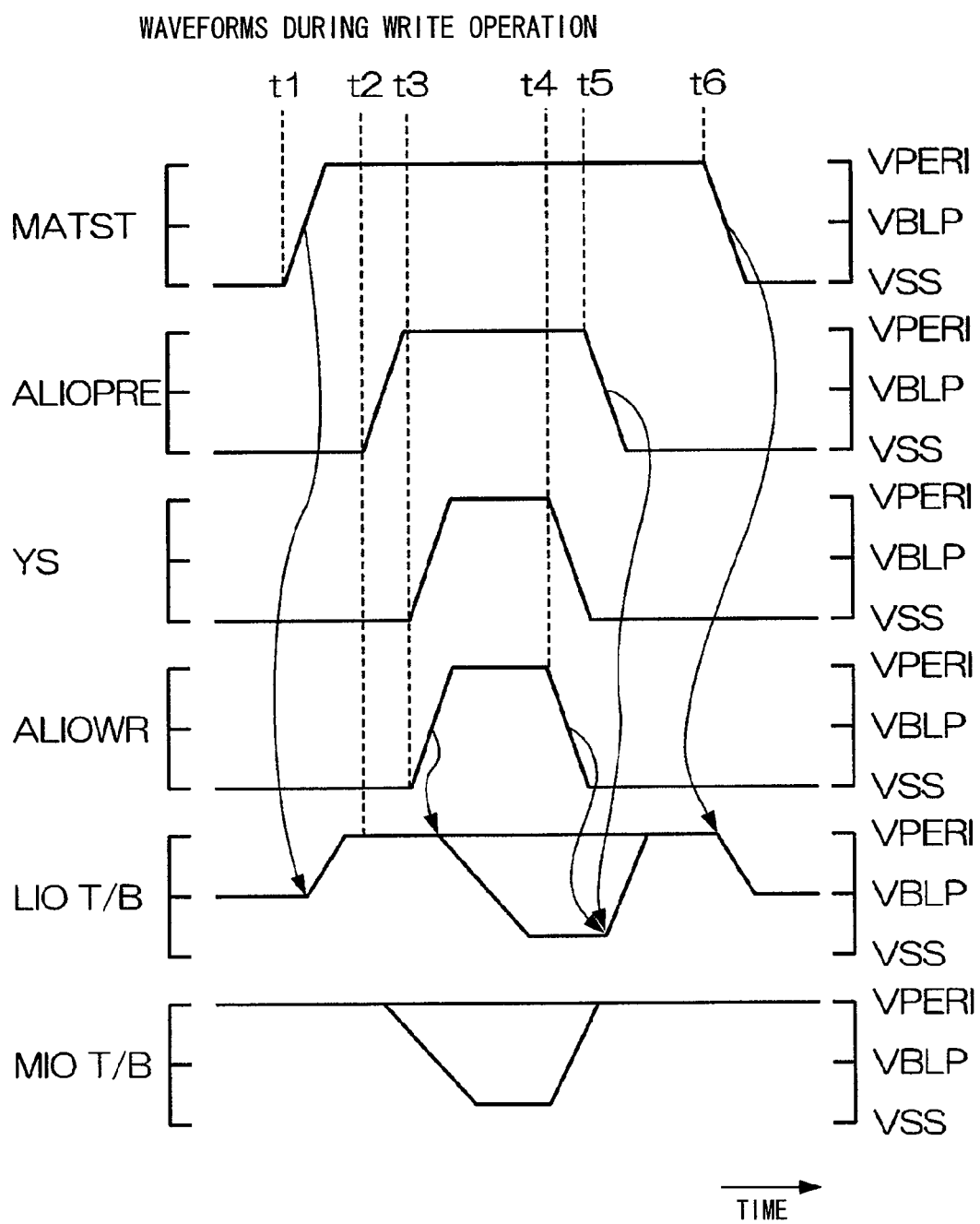
FIG. 6 is a waveform chart illustrating an operation when writing data in the configuration shown in FIG. 4.

FIGS. 5 and 6 are waveform charts illustrating an operation of the circuit shown in FIG. 4. FIG. 5 shows a waveform during the reading of data, and FIG. 6 shows a waveform during the writing of data. In FIGS. 5 and 6, VPERI denotes a peripheral circuit voltage, VBLP denotes a bit line equalized voltage, and VSS denotes a ground potential.

First, an operation during READ will be described with reference to FIG. 5. In the example shown in FIG. 5, it is assumed that the local IO line LIO is precharged to the voltage VBLP by a precharge circuit (not shown) in the initial state. First, at time t1, according to an ACT-command (activate command) input from the outside, the MATST signal is activated and the electric potential transits from VSS to VPERI. According to the transition of the MATST signal, the electric potential of LIO T/B (local IO lines LIOT and LIOB) transits from VBLP to VPERI. Then, at time t2, the ALIOPRE signal transits from VSS to VPERI according to transition of the DLIOPRE signal, which is shown in FIG. 4, according to the READ command input from the outside and the activated MATST signal. In addition, the equalized state of LIO T/B is released. However, there is no change in the waveform of LIO T/B at this point in time.

Then, at time t3, the YS signal is activated according to the READ command input from the outside, and the ALIORD signal is activated according to the READ command (DLIORD signal corresponding to the READ command) input from the outside. By the activation of the YS signal, a potential difference is generated between LIOT and LIOB according to the electric potential of a bit line. In addition, according to the activation of the ALIORD signal, the sub-amplifier 2 is activated and the electric potential of MIO T/B connected to LIO T/B changes.

Then, the YS signal and the ALIORD signal are deactivated at time t4 after a predetermined time has elapsed from time t3. Then, at time t5 after a predetermined time has elapsed, the ALIOPRE signal transits from VPERI to VSS. The sub-amplifier 2 stops due to the deactivation of the ALIORD signal. In addition, the electric potential of MIO T/B is changed by the operation of an equalizer circuit (not shown) of MIO T/B (main IO lines MIOT and MIOB). In addition, the electric potential of LIO T/B is equalized to VPREI according to the deactivation of the YS signal and the transition of the ALIOPRE signal.

Then, at time t6, when the MATST signal transits from VPERI to VSS according to a PRE command (precharge command) input from the outside, LIO T/B is precharged to VBLP by a precharge circuit (not shown).

Then, an operation during WRITE will be described with reference to FIG. 6. In the example shown in FIG. 6, it is assumed that the local IO line LIO is precharged to the voltage VBLP by a precharge circuit (not shown) in the initial state. First, at time t1, according to an ACT command (activate command) input from the outside, the MATST signal is activated and the electric potential transits from VSS to VPERI. According to the transition of the MATST signal, the electric potential of LIO T/B transits from VBLP to VPERI.

Then, at time t2, the ALIOPRE signal transits from VSS to VPERI according to transition of the DLIOPRE signal, which is shown in FIG. 4, according to the WRITE command input from the outside and the activated MATST signal. In addition, the equalized state of LIO T/B is released. However, there is no change in the waveform of LIO T/B at this point in time.

Then, at time t3, the YS signal is activated according to the WRITE command input from the outside, and the ALIOWR signal is activated according to the WRITE command (DLIOWR signal corresponding to the DLIOWR command) input from the outside. The sub-amplifier 2 is activated according to the activation of the ALIOWR signal, and a potential difference is generated between LIOT and LIOB according to the potential difference that is applied on MIO T/B according to the value of data to be written.

Then, the YS signal and the ALIOWR signal are deactivated at time t4 after a predetermined time has elapsed from time t3. Then, at time t5 after a predetermined time has elapsed, the ALIOPRE signal transits from VPERI to VSS. In addition, the sub-amplifier 2 stops and the electric potential of LIO T/B is equalized to VPREI according to the deactivation of the ALIOWR signal and the transition of the ALIOPRE signal.

Then, at time t6, when the MATST signal transits from VPERI to VSS according to a PRE command (precharge command) input from the outside, LIO T/B is precharged to VBLP by a precharge circuit (not shown).

Among the signals shown in FIGS. 5 and 6, the in-array sub-amplifier READ start timing signal ALIORD, the in-array sub-amplifier WRITE start timing signal ALIOWR, and the in-array LIO precharge signal ALIOPRE correspond to the sub-amplifier start timing signal on the sub-amplifier start timing signal line 4 shown in FIG. 3. In addition, the sub-amplifier start timing signal is generated based on the sub-amplifier timing signal on the sub-amplifier timing signal line 13 in FIG. 3 and the MAT address signal MATST, which corresponds to the MAT address on the MAT address line 5, by the gate circuit 3 which is disposed in another intersection region SWC_A within the same sense amplifier column as the intersection region SWC_B where the sub-amplifier 2 is disposed. Here, the sub-amplifier timing signal on the sub-amplifier timing signal line 13 is a signal which is supplied from the direction of the column decoder region YDEC together with the YS signal (=YS timing signal). Accordingly, in the present embodiment, the skew when signal switching between the YS signal (=YS timing signal) and the in-array sub-amplifier READ start timing signal ALIORD or in-array sub-amplifier WRITE start timing signal ALIOWR is performed is reduced compared with that in the case where the sub-amplifier timing signal and the YS signal (=YS timing signal) are supplied from the different directions.

As shown in FIGS. 5 and 6, in the present embodiment, the switching timing of the YS signal, that is, the switching timing (time t3) of the start signal (YS signal) of the YSW (column selection circuit) which connects between the local IO line LIO connected to the sub-amplifier 2 and the bit line BL connected to the memory cell within the memory cell mat MAT becomes approximately equal to the activation timing of the in-array sub-amplifier READ start timing signal ALIORD and in-array sub-amplifier WRITE start timing signal ALIOWR which is the starting timing of the sub-amplifier 2. As a result, the time margin in operation timing between these signals can be reduced compared with that in the related art.

Next, the characteristic configuration, modification, and the like of the present embodiment will be described below. The gate circuit 3 (start signal supply circuit) generates a start timing signal of the sub-amplifier 2 (start signal of the sub-amplifier) based on a sub-amplifier timing signal, which is supplied from the extending direction of the sub-word driver region SWD, and a MAT address (memory cell MAT address), which is a signal supplied from a direction perpendicular to the extending direction of the sub-word driver region SWD and which selects a memory cell mat column comprising the plurality of memory cell mats MAT arrayed in the direction perpendicular to the extending direction of the sub-word driver region SWD, and supplies the start timing signal to the plurality of intersection regions SWC_B (first intersection regions).

In addition, the start signal (YS timing signal) of the YSW (column selection circuit) which connects between the local IO line LIO connected to the sub-amplifier 2 and the bit line BIT connected to a memory cell (not shown) within the memory cell mat MAT is supplied from the extending direction of the sub-word driver region SWD.

In addition, the plurality of sub-amplifiers 2 are disposed in the intersection region SWC_B (first intersection region).

In addition, a sub-amplifier start timing signal (start signal of a sub-amplifier) is supplied from one gate circuit 3 (start signal supply circuit) to the plurality of sub-amplifiers 2.

In addition, the plurality of sub-amplifiers 2 to which the sub-amplifier start timing signal (start signal of a sub-amplifier) is supplied, are disposed in the same sense amplifier column among a plurality of sense amplifier columns comprising the plurality of sense amplifier regions SA arrayed in a direction perpendicular to the extending direction of the sub-word driver region SWD.

In addition, the sub-amplifier 2 and the gate circuit 3 (start signal supply circuit) are disposed in different intersection regions SWC_B and SWC_A among a plurality of intersection regions which are intersection regions between the plurality of sub-word driver regions SWD and the plurality of sense amplifier regions SA.

In addition, the plurality of sub-amplifiers 2 are disposed in the intersection region between the sub-word driver region SWD and the sense amplifier region SA.

In addition, all of the sub-amplifiers 2 disposed in the same sense amplifier column may be activated at approximately the same timing. In this case, a sense amplifier column in which the sub-amplifiers 2 activated simultaneously are disposed may be made to become a sense amplifier column adjacent to a memory cell mat column selected by the MAT address (memory cell MAT address).

In addition, the switching timing of the start signal (YS timing signal) of the YSW (column selection circuit) which connects between the local IO line LIO connected to the sub-amplifier 2 and the bit line BIT connected to a memory cell (not shown) within the memory cell mat MAT is approximately equal to the starting timing of the sub-amplifier 2.

In addition, the sub-amplifier 2 activated by a sub-amplifier start timing signal (start signal of a sub-amplifier) corresponds to one of the plurality of memory cell mat columns in which the plurality of memory cell mats MAT and the plurality of sub-word driver regions SWD disposed adjacent to the plurality of memory cell mats MAT are arrayed in one column.

In addition, only the sub-amplifier 2, which is adjacent to a memory cell mat column activated by a MAT address (memory cell MAT address) for selecting a memory cell mat column, is activated.

In addition, the plurality of gate circuits 3 (start signal supply circuits) may be provided so that a sub-amplifier start timing signal (start signal of a sub-amplifier) is supplied from one of the plurality of gate circuits 3 to each sub-amplifier 2.

In addition, the sub-amplifier 2 and the gate circuit 3 (start signal supply circuit) are disposed in a sense amplifier column in which the plurality of sense amplifier regions SA are arrayed adjacent to a plurality of memory cell mat columns in which the plurality of memory cell mats MAT and the plurality of sub-word driver regions SWD disposed adjacent to the plurality of memory cell mats MAT are arrayed in one column. In addition, the sub-amplifier 2 and the gate circuit 3 (start signal supply circuit) are disposed in different intersection regions SWC_B and SWCA among the intersection regions, which are regions arrayed side by side with the sub-word driver region SWD, other than the sense amplifier region SA within the sense amplifier column.

As described above, the semiconductor memory device according to the embodiment of the invention comprises: a plurality of memory cell mats (memory cell mats MAT); a plurality of sub-word driver regions (sub-word driver regions SWD) and a plurality of sense amplifier regions (sense amplifier regions SA) which are disposed adjacent to the plurality of memory cell mats; a plurality of intersection regions (intersection regions SWC_A or SWC_B) which are intersection regions between the plurality of sub-word driver regions and the plurality of sense amplifier regions; a sub-amplifier (sub-amplifier 2) that is disposed in the first intersection region (intersection region SWC_B) among the plurality of intersection regions; and a start signal (a control signal) supply circuit (gate circuit 3) that is disposed in a second intersection region (intersection region SWC_A), which is different from the first intersection region, among the plurality of intersection regions, and that supplies a start signal (sub-amplifier start timing signal) of the sub-amplifier to the sub-amplifier based on a sub-amplifier timing signal supplied from the extending direction of the sub-word driver region. In this case, it becomes possible to control the sub-amplifier 2 by supplying the start signal (sub-amplifier start timing signal) of the sub-amplifier 2, which is output from the start signal supply circuit, commonly to the plurality of first intersection regions (intersection regions SWC_B), that is, a plurality of intersection regions where the sub-amplifiers 2 are disposed. Accordingly, it is not necessary to generate the start signal of the sub-amplifier 2 in all intersection regions where the sub-amplifiers 2 are disposed, unlike the related art described above. As a result, an increase in the area of the intersection region where the sub-amplifier 2 is disposed can be suppressed.

In addition, the semiconductor memory device according to another embodiment of the invention comprises: a plurality of memory cell mats (memory cell mats MAT); a plurality of sub-word driver regions (sub-word driver regions SWD) which are disposed adjacent to the plurality of memory cell mats and each of which has a sub-word driver circuit; a plurality of sense amplifier regions (sense amplifier regions SA) which are disposed adjacent to the plurality of memory cell mats and each of which has a sense amplifier circuit; a plurality of sub-amplifiers (sub-amplifiers 2) that are disposed in a sense amplifier column comprising the sense amplifier region where the plurality of sense amplifier circuits simultaneously activated according to a selection operation of a memory cell mat column by a memory cell mat address, which selects one of memory cell mat columns comprising the plurality of memory cell mats among sense amplifier columns comprising the plurality of sense amplifier regions, are disposed; and a plurality of start signal supply circuits (gate circuits 3) that supplies start signals of the sub-amplifiers commonly to at least some of the plurality of sub-amplifiers disposed in the sense amplifier column. In this case, the sense amplifier column may be configured to comprise the plurality of sense amplifier regions arrayed in a direction perpendicular to the extending direction of the sub-word driver region, and the memory cell mat column may be configured to comprise the plurality of memory cell mats arrayed in the direction perpendicular to the extending direction of the sub-word driver region.

In addition, the semiconductor memory device according to still another embodiment of the invention comprises: a plurality of memory cell mats (memory cell mats MAT); a plurality of sub-amplifiers (sub-amplifiers 2) provided so as to correspond to the plurality of memory cell mats; and a start signal supply circuit (gate circuit 3) which supplies a start signal of the sub-amplifier to the plurality of sub-amplifiers. The start signal supply circuit may supply the start signal of the sub-amplifier to the plurality of sub-amplifiers so that only the sub-amplifier, which is provided so as to correspond to the activated memory cell mat among the plurality of memory cell mats, is activated.

Moreover, as described above, the gate circuit (gate circuit 3) generates the start signal (sub-amplifier start timing signal) of the sub-amplifier (sub-amplifier 2) based on the sub-amplifier timing signal, which is supplied from the extending direction of the sub-word driver region (sub-word driver region SWD), and the memory cell MAT address (MAT address), which is supplied from a direction perpendicular to the extending direction of the sub-word driver region (sub-word driver region SWD) and which selects a predetermined memory cell mat column within the memory cell mat MAT, and supplies the start signal to the plurality of first intersection regions (intersection regions SWC_B).

The start signal (sub-amplifier start timing signal) is supplied to the plurality of first intersection regions (intersection regions SWC_B) from the direction perpendicular to the extending direction of the sub-word driver region (sub-word driver region SWD).

As described above, in the semiconductor memory device according to the embodiment of the invention, the intersection regions between the sub-word driver regions SWD and the sense amplifier regions SA are divided into the intersection region SWC_B, in which the sub-amplifiers 2 are disposed, and the intersection region SWC_A, which is a different intersection region from the intersection region SWC_B and in which the gate circuit 3 as a start signal supply circuit (a sub-amplifier control circuit) that performs a logic operation between the sub-amplifier start timing signal and the MAT address signal is disposed. In addition, the sub-amplifiers 2 are controlled by supplying the sub-amplifier start timing signal, which is output from the gate circuit 3 as a start signal supply circuit (a sub-amplifier control circuit), commonly to the plurality of sub-amplifiers 2. Accordingly, it is not necessary to perform a logic operation between a sub-amplifier start timing signal and a MAT address signal in all sub-amplifiers 2, unlike the related art. As a result, an increase in the area of the sub-amplifier 2 can be suppressed.

In addition, the invention is not limited to the above-described embodiments, and may be changed without departing from the spirit and scope of the invention. In each intersection region or other regions in the embodiments of the invention, an element having a similar function may be applied as the constituent component. Accordingly, neither the number of components nor the connection conditions are particularly limited.

In the semiconductor memory device according to the aspect of the invention, the intersection regions between the sub-word driver regions and the sense amplifier regions are divided into the first intersection region, in which the sub-amplifiers are disposed, and the second intersection region, which is a different intersection region from the first intersection region and in which a start signal supply circuit (a sub-amplifier control circuit) that generates a start signal for starting the sub-amplifier is disposed. In addition, the sub-amplifier can be controlled by supplying the start signal of the sub-amplifier, which is output from the start signal supply circuit, commonly to the plurality of first intersection regions, that is, a plurality of intersection regions where the sub-amplifiers are disposed. Accordingly, it is not necessary to generate the start signal of the sub-amplifier in all intersection regions where the sub-amplifiers are disposed, unlike the related art described above. As a result, an increase in the area of the sub-amplifier can be suppressed.

Furthermore, in the semiconductor memory device according to another aspect of the invention, the start signal of the sub-amplifier is commonly supplied to at least some of the plurality of sub-amplifiers that are disposed in a sense amplifier column comprising the sense amplifier region where a plurality of sense amplifier circuits simultaneously activated according to the selection operation of the memory cell mat column by the memory cell mat address, which selects one of the memory cell mat columns. Accordingly, it is not necessary to generate the start signal of the sub-amplifier in all intersection regions where the sub-amplifiers are disposed, unlike the related art described above. As a result, an increase in the area of the sub-amplifier can be suppressed.

Furthermore, in the semiconductor memory device according to another aspect of the invention, the start signal supply circuit which supplies the start signal of the sub-amplifier to the plurality of sub-amplifiers is provided, and the start signal of the sub-amplifier is supplied such that only the sub-amplifier, which is provided so as to correspond to the activated memory cell mat among the plurality of memory cell mats, is activated. Accordingly, it is not necessary to generate the start signal of the sub-amplifier in all intersection regions where the sub-amplifiers are disposed, unlike the related art described above. As a result, an increase in the area of the sub-amplifier can be suppressed.

It is apparent that the present invention is not limited to the above embodiments, but may be modified and changed without departing from the scope and spirit of the invention.

What is claimed is:

1. A device comprising:
a first memory area including a first memory cell array, a plurality of first sense amplifiers, and a plurality of first sub-amplifiers;
at least one control line connected in common to the first sub-amplifiers, each of the first sub-amplifiers being activated in response to an active level of the control line, the control line being extended up to outside of the first memory area; and
a sub-amplifier control circuit disposed outside the first memory area to be connected to the control line, the sub-amplifier control circuit receiving a set of control data to bring the control line to the active level,
wherein the first memory area further includes first and second regions arranged in line in a first direction, each of the first and second regions includes first and second parts arranged in line in a second direction perpendicular to the first direction, the first memory cell array includes a first set of memory cells disposed in the first part of the first region and a second set of memory cells disposed in the first part of the second region, the first sense amplifiers includes a first set of sense amplifiers disposed in the second part of the first region and a second set of sense amplifiers disposed in the second part of the second region, the first memory area further includes a third region between the first and second regions, the third region includes third and fourth parts arranged in line in the second direction, the first sub-amplifiers are disposed in the third part of the third region.

2. The device as claimed in claim 1, wherein the first memory area further includes a set of word line drivers disposed in the fourth part of the third region.

3. The device as claimed in claim 1, wherein the first parts of the first and second regions and the fourth part of the third region are arranged in line in the first direction, the second parts of the first and second regions and the third part of the third region are arranged in line in the first direction.

4. The device as claimed in claim 1, further comprising a second memory area including a second memory cell array, a plurality of second sense amplifiers, and a plurality of second sub-amplifiers, and wherein the at least one control line is connected in common to the second sub-amplifiers, each of the second sub-amplifiers is activated in response to the active level of the control line, and the control line is extended up to outside of the second memory area.

5. The device a claimed in claim 4, wherein the sub-amplifier control circuit is sandwiched between the first and the second memory areas.

6. The device as claimed in claim 4, wherein the first memory area further includes first and second regions arranged in line in a first direction, each of the first and second regions includes first and second parts arranged in line in a second direction perpendicular to the first direction, the first memory cell array includes a first set of memory cells disposed in the first part of the first region and a second set of memory cells disposed in the first part of the second region, the first sense amplifiers include a first set of sense amplifiers disposed in the second part of the first region and a second set of sense amplifiers disposed in the second part of the second region, the first memory area further includes a third region between the first and second regions, the third region includes third and fourth parts arranged in line in the second direction, the first sub-amplifiers are disposed in the third part of the third region, the second memory area further includes fourth and fifth regions arranged in line in the first direction, each of the fourth and fifth regions includes first and second parts arranged in line in the second direction, the second memory cell array includes a third set of memory cells disposed in the first part of the fourth region and a fourth set of memory cells disposed in the first part of the fifth region, the second sense amplifiers include a third set of sense amplifiers disposed in the second part of the fourth region and a fourth set of sense amplifiers disposed in the second part of the fifth region, the second memory area further includes a sixth region between the fourth and fifth regions, the sixth region includes third and fourth parts arranged in line in the second direction, the second sub-amplifiers are disposed in the third part of the sixth region.

7. The device as claimed in claim 6, wherein the first memory area further includes a first set of word line drivers disposed in the fourth part of the third region, and the second memory area further includes a second set of word line drivers disposed in the fourth part of the sixth region.

8. The device as claimed in claim 6, wherein the first parts of the first, the second, the fourth, and the fifth regions and the fourth parts of the third and the sixth regions are arranged in line in the first direction, and the second parts of the first, the second, the fourth, and the fifth regions and the third parts of the third and the sixth regions are arranged in line in the first direction.

9. The device as claimed in claim 6, further comprising a seventh region sandwiched between the first memory area and the second memory area, and including third and fourth parts arranged in line in the second direction, and wherein the first parts of the first, the second, the fourth and the fifth regions and the fourth, parts of the third, the sixth and seventh regions are arranged in line in the first direction, and the second parts of the first, the second, the fourth and the fifth regions and the third parts of the third, the sixth and the seventh regions are arranged in line in the first direction, and the sub-amplifier control circuit is disposed in the third part of the seventh region.

10. The device as claimed in claim 9, further comprising a plurality of word line drivers each disposed in a corresponding one of the fourth parts of the third, the sixth and the seventh regions.

* * * * *